US005777356A

United States Patent [19]
Dhote et al.

[11] Patent Number: 5,777,356
[45] Date of Patent: Jul. 7, 1998

[54] PLATINUM-FREE FERROELECTRIC MEMORY CELL WITH INTERMETALLIC BARRIER LAYER AND METHOD OF MAKING SAME

[75] Inventors: Anil M. Dhote, College Park; Ramamoorthy Ramesh, Burtonsville, both of Md.

[73] Assignee: Bell Communications Research, Inc., Morristown, N.J.

[21] Appl. No.: 582,545

[22] Filed: Jan. 3, 1996

[51] Int. Cl.[6] .................................................. H01L 29/76
[52] U.S. Cl. ........................ 257/295; 257/300; 257/304
[58] Field of Search .............................. 257/295, 296, 257/298, 300, 303, 304, 306, 310

[56] References Cited

U.S. PATENT DOCUMENTS

| | | | |
|---|---|---|---|
| 4,017,890 | 4/1977 | Howard et al. | 357/67 |
| 5,051,792 | 9/1991 | Sands | 357/22 |
| 5,075,755 | 12/1991 | Sands | 357/67 |
| 5,088,002 | 2/1992 | Ogawa | 361/321 |
| 5,169,485 | 12/1992 | Allen | 156/603 |
| 5,343,353 | 8/1994 | Miki et al. | 361/322 |
| 5,371,699 | 12/1994 | Larson | 365/145 |
| 5,406,445 | 4/1995 | Fujii et al. | 361/305 |
| 5,449,933 | 9/1995 | Shindo et al. | 257/295 |

OTHER PUBLICATIONS

Ogawa, T. et al., "Ferroelectricity of Lanthanum–Modified Lead–Titanate Thin Films Deposited on Nickel Alloy Electrodes," Mat. Res. Soc. Symp. Proc., vol. 243, pp. 93–99, no date.

Lee, K. B. et al., "Effect of Surface Morphology of NiCr–Bottom Electrode on Preparation of Ferroelectric PZT Thin Film Capacitor," Mat. Res. Soc. Symp. Proc., vol. 433, pp. 181–186, no date.

Baker, H., Ed., "Alloy Phase Diagrams," *ASM Handbook*, ASM International, vol. 3, 1992, pp. 2•49, 3•9, no date.

Liu et al., "Ordered Intermetallics," *ASM Handbook*, ASM International, vol. 2, Properties and Selection: Nonferrous Alloys and Special–Purpose Materials, 1992, pp. 913–942, no month.

Kinney, "Signal magnitudes in high density ferroelectric memories," *Integrated Ferroelectrics*, vol. 4, 1994, pp. 131–144.

Lines and Glass, *Principles and Applications of Ferroelectrics and Related Materials*, (Clarendon Press, 1997), pp. 620–625.

*Primary Examiner*—Sara W. Crane
*Assistant Examiner*—Douglas A. Wille
*Attorney, Agent, or Firm*—Joseph Giordano; David A. Hey; Loria B. Yeadon

[57] ABSTRACT

A ferroelectric memory cell integrated on a silicon substrate. The ferroelectric stack includes a ferroelectric layer, such as PbNbZrTiO, sandwiched between conductive metal-oxide electrodes, such as the perovskite LaSrCoO. The ferroelectric stack is grown over a barrier layer of an intermetallic alloy such as $Ni_3Al$ or $Ti_3Al$, which is highly resistant to oxidation at elevated temperatures. The intermetallic layer is either deposited directly over the silicon substrate or over an intermediate TiN layer. The resulting structure does not require a platinum barrier layer.

21 Claims, 8 Drawing Sheets

PLATINUM-FREE FERROELECTRIC MEMORY CELL WITH INTERMETALLIC BARRIER LAYER AND METHOD OF MAKING SAME

FIELD OF THE INVENTION

The invention generally relates to ferroelectric structures integrated onto substrates such as silicon. In particular, the invention relates to metallic barrier layers interposed between the substrate and the ferroelectric stack.

BACKGROUND OF THE INVENTION

Integrated circuit memory cells have become increasingly important as personal computers and other computerized equipment have found acceptance in many and varied applications. Dynamic random-access memory (DRAM) is currently the most popular type of randomly accessible memory for personal computers, but it suffers from its need to be periodically refreshed and its loss of information in the case of a power failure or system crash. Static RAM relies on flip-flop circuitry and does not need to be refreshed, but it still loses its contents when power is removed. Furthermore, it requires considerably more power than DRAM. Non-volatile memories have been developed for certain critical applications in which memory loss is not acceptable. These range from preprogrammed read-only memory (ROM) to electrically alterable non-volatile memory, but these impose operational or cost penalties relative to DRAM and are difficult to integrate to the 64- and 256-megabyte levels currently promised by advanced DRAM technology.

Figure 1:
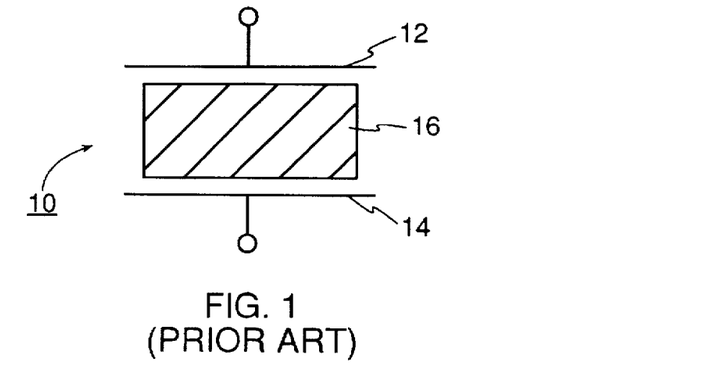
FIG. 1 is a schematical representation of a generic ferroelectric memory cell.

What is needed is a memory technology that offers not only non-volatile storage but also substantially no power requirement during prolonged storage and a structure as simple as the capacitive storage of DRAM so as to allow dense integration. Ferroelectric memories have long offered the possibility of satisfying these requirements. In very simple terms, as illustrated in FIG. 1, a basic ferroelectric memory cell 10 includes two capacitive electrodes 12 and 14 sandwiching in its capacitive gap a bistable, polarizable ferroelectric material 16. A bistable, polarizable ferroelectric has the characteristic that it can assume two stable polarization states, generally referred to as up and down, dependent upon a poling voltage applied to it. Once induced into one of these polarization states, the polarizable material remains in the selected polarization state for very long periods of time. The polarization state determines the capacitance experienced by the electrodes 12 and 14. Hence, once a memory cell has been poled into one of two states, the state is thereafter held without further powering and it can be read by measuring the capacitance of the cell 10, that is, the ratio of charge to voltage across the cell. Furthermore, ferroelectrics typically manifest very high dielectric constants in either of their two states so that signal levels are relatively high compared to the area of the capacitors.

Although conceptually simple, ferroelectric memory cell has been difficult to implement in an integrated circuit similar to a silicon DRAM. Materials manifesting the largest ferroelectric behavior are metal oxides, typically having a perovskite crystal structure. Hence, their integration into silicon circuitry has proved to be a major problem. Integration with silicon is desirable not only because silicon technology offers the experience of a major industry over several decades, but also silicon support circuitry is generally required to read, write, and otherwise control a dense ferroelectric memory array. Therefore, a commercially successful ferroelectric technology must be integrated with silicon materials and silicon processing. A greatly desired architecture includes a thin planar layer of a ferroelectric sandwiched between two electrode layers in an integrated vertical structure built upon a silicon substrate, similar to a DRAM.

However, ferroelectrics integrated on a silicon substrate present some fundamental problems. Ferroelectric materials are typically perovskites, such as the prototypical ferroelectrics PZT (lead zirconium titanate) and PLZT (lead lanthanum zirconium titanate) although many other perovskite ferroelectrics are known, such as SrBiTaO and other materials to be listed later. These perovskites are rich in oxygen and usually need to be deposited at a relatively high temperature in a strongly oxidizing environment. As a result, the oxygen tends to diffuse out to the underlying material, in this case silicon. However, the semiconductivity of silicon is adversely affected by the incorporation of oxygen because of the ready formation of the insulating silicon dioxide.

This integration of ferroelectrics with silicon has produced several designs, each with its own difficulties. A popular design has included platinum electrodes sandwiching the ferroelectric. The platinum, being a noble, refractory metal, resists the diffusion of oxygen from the ferroelectric down to the underlying silicon. However, platinum is a metal, and unless it is carefully grown it forms as a polycrystalline layer. Hence, the ferroelectric deposited over it also has a random orientation with a large number of grain boundaries, which cause problems with reproducibility and reliability. Another approach uses conductive metal oxides as the electrode material. Many of these materials, such as lanthanum strontium cobalt oxide (LSCO), have a perovskite crystal structure similar to that of the most common ferroelectrics, such as PLZT. As such, the perovskite metal oxide acts not only as the electrode but also as a growth template for the perovskite ferroelectric. The lower metal-oxide electrode can be deposited on a platinum layer without the platinum adversely affecting the ferroelectric layer. However, platinum still introduces significant difficulties in fabricating integrated circuits. Because platinum is highly refractory, it is very difficult to etch, and etching of almost every layer is required for complex integrated-circuit processing. At the present time, there is no known way of dry etching platinum, that is, using reactive ion etching. Ion milling platinum is known, but this process introduces debris onto the wafer being processed. Hence, it would be preferable if platinum were completely avoided, at least at the lower levels, in a ferroelectric memory cell.

We have disclosed in U.S. patent application, Ser. No. 08/578,449, filed Dec. 26, 1995 entitled "Electrode Structure and Method of Making for Ferroelectric Capacitor Integrated on Silicon" that the platinum is not necessary and the lower metal-oxide electrode can be deposited directly on a TiN barrier layer, thus eliminating the need to etch platinum. However, this process is not proven, and the oxidation temperature of TiN at around 400° C. instills doubts about depositing a metal oxide above it.

It is thus desirable to eliminate platinum from the lower electrode in the ferroelectric cell and to find another material that is effective as a barrier to the passage of oxygen.

SUMMARY OF THE INVENTION

The invention can be summarized as an electrical element, such as a capacitor, and its method of making. The element is sequentially deposited on a substrate, such as silicon, and includes two electrodes sandwiching a layer of a ferroelectric or other perovskite material. Preferably, the electrodes are composed of a conductive metal oxide. A barrier layer of an intermetallic alloy is interposed between the bottom electrode and the substrate to prevent, among other problems, the oxygen from the oxygen-rich ferroelectric or electrodes from migrating downwardly and adversely affecting the underlying substrate.

DETAILED DESCRIPTION OF THE PREFERRED EMBODIMENTS

We have discovered that a ferroelectric memory cell formed on a silicon substrate by sequential depositions of layers can use a barrier layer of an intermetallic alloy that underlies the ferroelectric stack including its metal-oxide electrodes and that preferably contacts the lower electrode. The resulting ferroelectric cell has been found to demonstrate superior electrical properties. Platinum does not need to be included in the structure of the memory cell. An intermetallic alloy, as will be explained more fully later, has a composition of at least two metallic elements in a ratio that is stoichiometric or nearly so. Nickel aluminum ($Ni_3Al$) is a prototypical intermetallic alloy. Intermetallic alloys are well known for their resistance to oxidation at high temperatures, which is the environment faced by at least the bottom electrode during the over growth of a perovskite ferroelectric in an oxygen-rich environment at relatively high temperatures. Thus, such a ferroelectric memory cell can be advantageously used in an integrated circuit incorporating large numbers of such memory cells.

Figure 2:
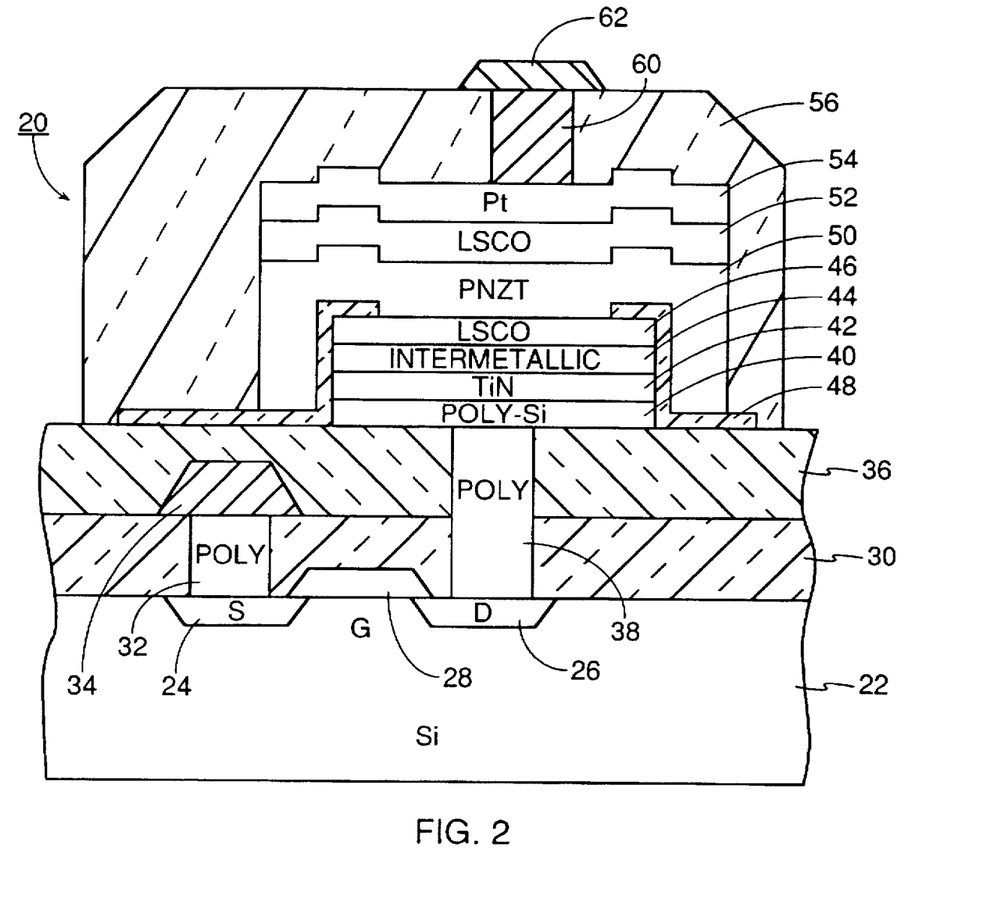
FIG. 2 is a cross-sectional view of a ferroelectric memory cell of the invention utilizing an intermetallic barrier layer.

An exemplary structure for a ferroelectric random access memory (FRAM) 20, similar to a silicon dynamic RAM, is illustrated in cross section in FIG. 2. It is understood that this FRAM structure is replicated many times to form a large FRAM integrated circuit and that other support circuitry needs to formed as well in the same chip. The overall FRAM structure, with a few exceptions, is known and has been disclosed by Ramesh in the previously cited U.S. patents and applications. Kinney provides a good overview in "Signal magnitudes in high density ferroelectric memories," *Integrated Ferroelectrics*, vol. 4, 1994, pp. 131–144. The FRAM 20 is formed on a (001)-oriented crystalline silicon substrate 22 so that other silicon circuitry can easily be incorporated. A metal-oxide-semiconductor (MOS) transistor is formed by diffusing or implanting dopants of conductivity type opposite to that of the substrate 22 into source, drain wells 24 and 26. The intervening gate region is overlaid with a gate structure 28 including a lower gate oxide and an upper metal gate line, e.g., aluminum to control the gate.

A first inter-level dielectric layer 30, for example of silicon dioxide, is deposited over the substrate 22 and the transistor structure. A via 32 is photolithographically etched through the first inter-level dielectric layer 30 over the source well 24, and polysilicon is filled therein to form a polysilicon contact plug to the transistor source. A metal source line 34 is photolithographically delineated on top of the first inter-level dielectric layer 30 and electrically contacts the polysilicon plug 32.

A second inter-level dielectric layer 36 is then deposited over the first inter-level dielectric layer 30. Another via 38 is etched through both the first and second inter-level dielectric layers 30, 36 over the area of the drain well 26, and polysilicon is filled therein to form a contact to the transistor drain. The processing up to this point is very standard in silicon technology.

A lift-off mask is then deposited and defined to have an aperture over the drain via 38 but of a larger area for the desired size of capacitor although in commercial manufacture a masked dry plasma etch would typically be performed in place of the lift off. Over the mask and into the aperture are deposited a sequence of layers. A polysilicon layer 40 provides good electrical contact to the polysilicon plug 38. A TiN layer 42 forms a first conductive barrier layer between the polysilicon and the oxidizing ferroelectric layer. Polysilicon is semiconductive, and, if its surface is oxidized into $SiO_2$, a stable, insulating layer is formed that prevents electrical contact.

Over the TiN layer 42 is deposited a layer 44 of an intermetallic alloy such as $Ti_3Al$ to a thickness of about 100 nm. Both the TiN layer 42 and the intermetallic layer 44 are conductive and act as barriers. Additionally, the titanium is a well known glue material, thus providing bonding between the underlying silicon and the after deposited. Titanium nitride was the originally used barrier material, but it suffers from oxidation above 450° C. As an alternative, the intermetallic layer can be used as the only barrier layer good at high and low temperatures, and it additionally provides bonding, especially when its composition is appropriately chosen, such as including titanium to provide the glue function. That is, the invention includes a structure free of TiN or similar barrier layers of refractory nitrides.

Over the intermetallic layer 44 is deposited a layer 46 of a conductive metal-oxide, such as lanthanum strontium cobalt oxide (LSCO). This material has a composition nominally given by $La_{0.5}Sr_{0.5}CoO_3$, although compositions of approximately $La_{1-x}Sr_xCoO_3$ are possible with $0.15 \geq x \geq 0.85$. It is now well known that LSCO forms an acceptable electrical contact and further promotes highly oriented growth of perovskite ferroelectric materials. As mentioned before, because of the highly refractory nature of the intermetallic layer 42, the lower LSCO electrode 46 can be grown directly on the intermetallic layer 44, and this in turn can be grown directly on the silicon 40 without the need of the TiN barrier layer 42.

It is understood that electrodes of materials other than LSCO may be used with the invention. Preferably they are formed of a conductive metal oxide, and most preferably a perovskite such as LSCO. See our previously cited patent application for a partial list.

The photomask is then lifted off leaving the lower stack of layers 40, 42, 44, 46 shown in FIG. 2. Another photomask is then defined allowing the conformal deposition of a Z-shaped field-oxide layer 48, which covers the sides of the previously defined lower stack, has a rim extending over the edge of the upper surface of the lower stack, and has a foot extending outwardly from the bottom of the lower stack, but leaves a central aperture for the after deposited upper ferroelectric stack. The field-oxide layer 48 electrically insulates the after deposited ferroelectric from the side portions of the lower electrode. We explain in the above cited patent application, the field-oxide layer 48 is preferably formed of bismuth titanate ($Bi_4Ti_3O_{12}$) or other highly resistive perovskites, although past practice has favored $TiO_2$.

After the formation of the field oxide 48, another photomask is deposited and defined that includes an aperture around the lower stack 40, 42, 44, 46 but the outer periphery of its bottom overlies the feet of the field-oxide layer 48. A ferroelectric layer 50 is then deposited under conditions favoring crystallographically oriented growth. Preferably, the ferroelectric layer 50 comprises lead niobium zirconium titanate (PNZT) although the invention is not limited to this material. Many ferroelectric materials are known, and a partial list of such materials will be presented later.

Over the ferroelectric layer 50 is deposited an upper conductive layer 52. Although not required by the invention, the upper conductive metal-oxide layer 52 is preferably symmetrically formed with the lower conductive metal-oxide layer 44 of a perovskite, such as LSCO. The deposition of the perovskite ferroelectric layer over LSCO or other similar perovskite conductive electrodes allows the ferroelectric to be deposited at relatively low temperatures but still manifest favorable crystallinity, and the electrode symmetry reduces the asymmetry of ill-controlled electrical characteristics. An upper platinum layer 54 is deposited over the upper conductive metal-oxide layer 52. This layer 54 is not considered to involve critical technology, and its platinum composition was selected only as an interim solution. It is anticipated that the composition will be changed to TiW or other metallization common in silicon technology. After the upper platinum layer 54 is deposited, the photomask is lifted off leaving the structure of the upper stack illustrated in FIG. 2.

A third inter-layer dielectric layer 56 is deposited and etched to cover the ferroelectric stack. This layer 56 is intended more as a passivation layer than as an inter-layer dielectric.

The upper electrode 54 is then electrically contacted by etching a via 60 through the third inter-level dielectric layer 56 overlying the ferroelectric stack, filling the via 60 with Ti/W, and delineating a metal capacitor line 62 of Al that electrically contacts the Ti/W plug 60.

This structure of the invention differs from that we disclosed in the previously cited patent application in that one conductive barrier layer is composed of an intermetallic alloy rather than of platinum. These alloys have been intensively investigated in the aircraft industry, particularly for jet turbine blades, because of their toughness, strength, and resistance to corrosion at high temperatures, in the 800° to 1200° C. range, in the highly corrosive and oxidizing environment of a jet-engine exhaust. Much of this work is referenced in the MRS proceedings: (1) *High Temperature Ordered Intermetallic Alloys IV*, Proceedings of Materials Research Society, vol. 213, eds. Johnson et al, 1990; (2) *High Temperature Ordered Intermetallic Alloys V*, Proceedings of Materials Research Society, vol. 288, eds. Baker et al, 1992; (3) *High Temperature Ordered Intermetallic Alloys VI*, Proceedings of Materials Research Society, vol. 364, eds. Horton et al, 1994; and (4) *Superalloys, supercomposites and superceramics*, Material Science and Technology Series, eds. Tien et al. (Academic Press, 1989).

Intermetallic alloys are metallic alloys that typically consists principally of two metallic elements although ternary and higher-order intermetallic alloys are possible. Usually, at least one of the metals of the intermetallic alloy is refractory. Also, the literature is replete with suggestions to further improve the oxidation resistance of intermetallic alloys by appropriate doping, for example, of Nb and V substituents to the limit of about 5 atomic % although doping up to 8 and 10% have been reported. In contrast to a metallic solid solution which can alloy over a continuously variable and relatively broad alloying percentage of its constituents, intermetallic alloys are characterized by the stoichiometry or near stoichiometry of their constituents, that is, two metals A and B can form a series of intermetallic alloys of composition AB, $AB_2$, $AB_3$, $A_3B$, etc. Deviations from stoichiometry are typically limited to ±5 atomic %, especially for intermetallic alloys of atomic component ratios of 3:1 and less.

These alloys are similar to inorganic compounds such as NaCl where the two ions Na and Cl are required to be in a fixed atomic ratio of 1:1. Although the principal compositions are based on Ni—Al, Ni—Ti, Nb—Li, and Nb—Al, there are many derivative compositions of these alloys since many metals form such line compounds. Interesting examples exist in the series FeAl, CoAl, NiAl, and MnAl, some of which have been reported by Sands in U.S. Pat. Nos. 5,169,485 and 5,075,755 for use in electronic applications.

Some preferred compositions for the intermetallic alloy are NiTi, $Ni_3Ti$, NiAl, $Ni_3Al$, $Ni_3Nb$, $Nb_3Al$, NiW, and $Co_3Al$. More general preferred families are represented by the chemical formulae AB, $AB_2$, $AB_3$, $A_2B$ and $A_3B$, where A is chosen from the group of Fe, Cr, Co, Ni, Mn, Mo, and Nb and where B is chosen from the group of Al, Ti, Cr, Si, Ru, Re, and W. Popular quaternary systems are $(Co,Ni)_3(Al,Ti)$ and $(Co,Ni)_2(Al,Ti)$. Related intermetallic alloys such as TiAl and NiCo can be characterized as AA' or BB' alloys, that is, components from only the A or B group. Two well studied intermetallic alloys are $NiNb_{0.0197}Cr_{0.06}Al_{0.025}$ and $NiNb_{0.2175}Al_{0.0255}$. These last two alloys are related to $Ni_3Al$, but with optimized compositions. As noted before, dopants, especially vanadium and niobium, may be substituted into the alloy.

Wet chemical etching of intermetallic alloys is well known. It is believed that chlorine-based dry plasma etching can be adapted to intermetallic alloys in a process very close to standard etching of silicon integrated circuits.

A number of sets of samples were fabricated and tested in a number of different ways. The deposition was performed using pulsed laser ablation from a pulsed KrF excimer laser producing a laser fluence of 3 J-$cm^{-2}$ on the target being ablated. Laser ablation is a convenient method for testing new materials, but it is anticipated that chemical vapor deposition or physical vapor deposition will be used in commercial fabrication lines.

The deposition of the intermetallic layer and the ferroelectric stack including the ferroelectric and sandwiching metal-oxide electrodes were performed in a chamber at a single temperature with the targets being remotely switched between the layers. The temperature was measured on the substrate holder, which is believed to be about 20° to 40° C. higher than the actual substrate temperature in the 500° to 650° C. temperatures employed in the reported experiments. The deposition apparatus deposited the layers on a crystalline silicon substrate precoated with a polysilicon layer and a covering TiN layer. The thickness of these layers were respectively 100 to 500 nm and 50 to 70 nm.

The intermetallic alloy was ablated from a target having a composition of $Ti_3Al$ with small amounts of Nb doping to the level of about 5 atomic %. The chamber pressure during the intermetallic deposition was in the range of $10^{-6}$ to $10^{-7}$ Torr and was essentially oxygen-free. The intermetallic layer was formed by 3000 shots of the laser and is believed to have formed to a thickness of about 100 nm. The intermetallic alloy was deposited at the same temperature as that used for the ferroelectric stack only as a matter of convenience, and its deposition temperature can be independently optimized in the range of room temperature to about 650° C.

The ferroelectric stack was deposited by pulsed laser ablation in an environment of 100 mTorr of $O_2$. The stack consisted of electrodes of $La_{0.5}Sr_{0.5}CoO_3$ (LSCO), each having a thickness of about 100 nm. The ferroelectric layer was composed of $PbNb_{0.04}Zr_{0.28}Ti_{0.68}O_3$ (PNZT), as determined from the target composition, having a thickness of 300 nm. However, these conditions and this process are presented only as an example. Many other conditions for laser ablation and other processes are possible to achieve the invention, for example, chemical-vapor deposition, plasma sputtering, and e-beam sputtering.

Experiment 1

Figure 3:
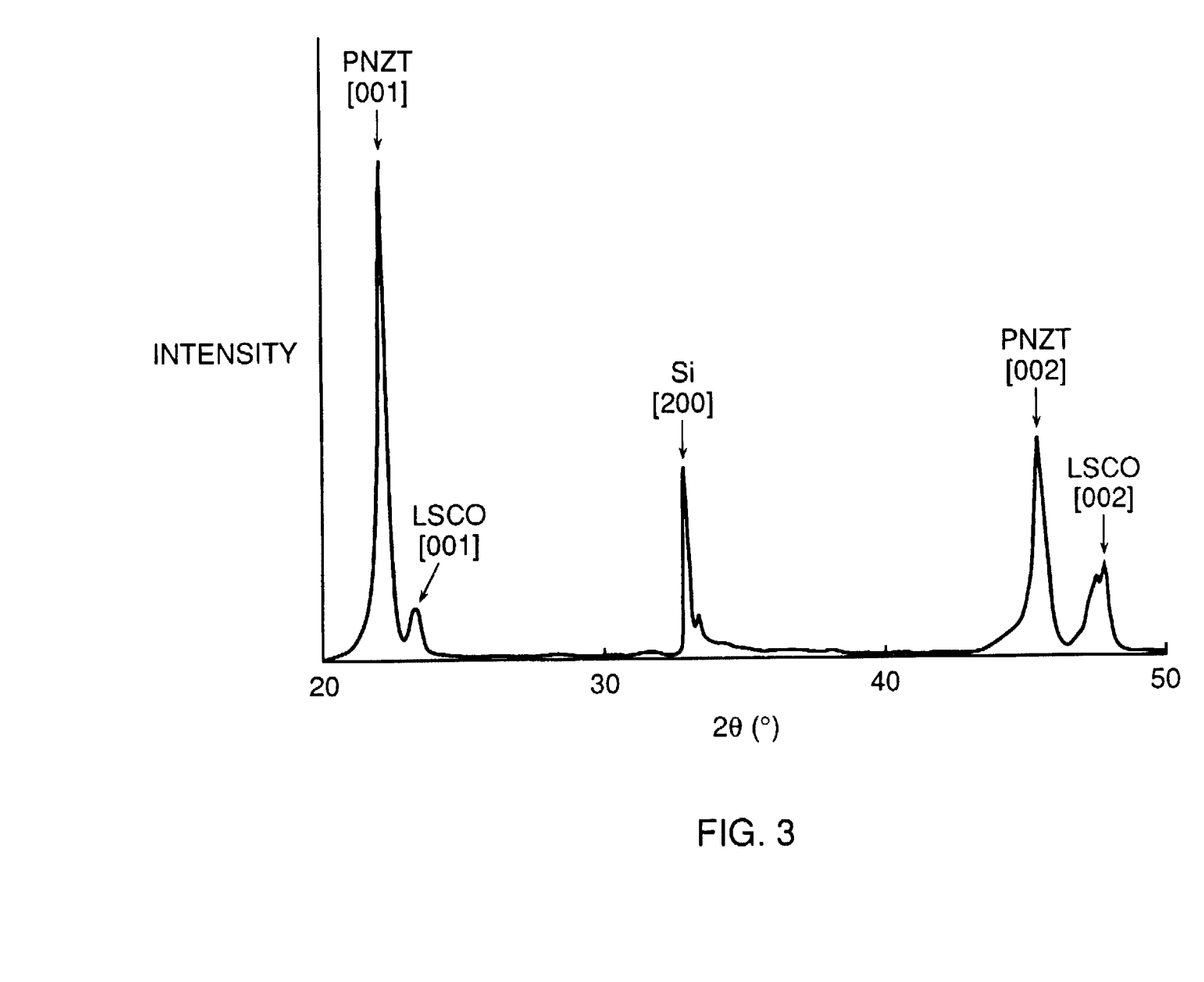
FIG. 3 is an X-ray diffraction pattern for a vertical structure built according to the invention.

In one experiment, a wafer was deposited at 650° C. for both the ferroelectric stack and the intermetallic layer. An X-ray diffraction pattern, shown in the graph of FIG. 3, was measured on an unpatterned wafer. The peaks are labeled with the Bragg diffraction peaks identified to the various materials. Both the PNZT and LSCO layers show strong [001] perovskite Bragg peaks, indicating a preferred [001] perovskite orientation throughout the ferroelectric stack. The polysilicon peak was not observed because the polysilicon layer was only about 100 nm thick. Importantly, the diffraction pattern fails to show any pyrochlore-phase peaks, for example, one anticipated at 35°. That is, the entire ferroelectric stack seems to have grown in the perovskite rather than the pyrochlore phase.

Experiment 2

Figure 4:
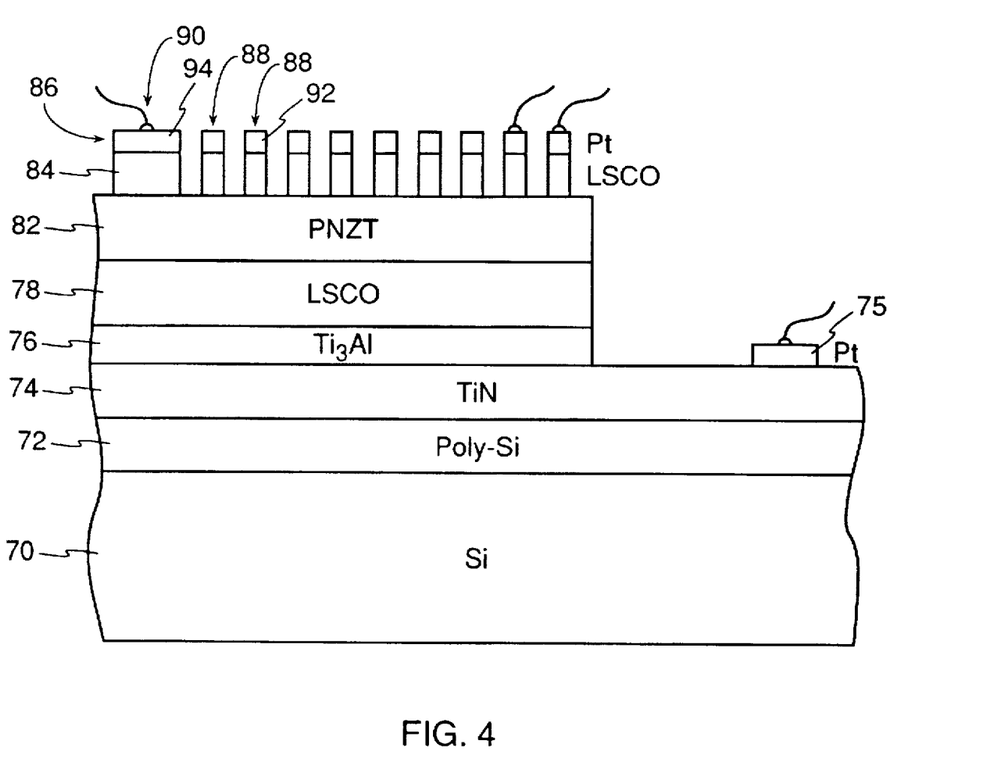
FIG. 4 is a cross-sectional view of a test structure incorporating a large number of ferroelectric capacitors of the invention.

In a further elaboration of Experiment 1, the deposited layer was defined into a test structure, shown in the cross section of FIG. 4, incorporating a large number of ferroelectric capacitors. The base structure consisted of a crystalline silicon substrate 70 that was supplied with overgrown polysilicon and TiN layers 72, 74. The test structure included two alternative bottom contacting structures, one a direct bottom contact and the other a top capacitively-coupled top contact.

For the direct bottom contact, the principal capacitor area of the wafer was masked, an area for a bottom metal contact 75 was delineated, and the platinum contact material was deposited. This bottom-contact area was then masked, and the ferroelectric-stack structure was deposited over the unmasked area. The ferroelectric stack structure was deposited by pulsed laser ablation to deposit an intermetallic layer 76 of $Ti_3Al$ and a ferroelectric stack consisting of a lower LSCO electrode layer 78, a ferroelectric PNZT layer 80, and an upper LSCO electrode layer 82. The particulars of this deposition sequence and vertical structure are given above. The structure was then overlaid with a photolithographic lift-off mask for defining a platinum layer 86 principally into an array of capacitor dots 88 having diameters of 50 μm, but also defining one or more large capacitor areas 90, which are much larger than the relative size illustrated in FIG. 4. The large capacitor areas 90 are used to provide an effective topside contact for the bottom electrode 78 by capacitively coupling to it.

Hysteresis measurements showed that the capacitive coupling configuration produced slightly better ferroelectric effects, but the difference was small, and the following data will not differentiate the two configurations.

Pulsed laser ablation was used to deposit the platinum layer 86 over the patterned lift-off mask, and the patterned lift-off mask was then removed to leave platinum pads 92, 94 defining the capacitor dots 88 and the large capacitor area 90. The so defined platinum pads 92, 94 were then used as shadow mask for a wet chemical etching of the upper LSCO electrode layer 78 by a 1% $HNO_3$ aqueous solution, thereby completing the definition and electrical isolation of the capacitor dots 86 and the large capacitive coupling area 88.

Each ferroelectric capacitor in the array can be electrically tested by probe testing both the platinum pad 92 associated with that capacitor dot 88 and either the bottom platinum contact 74 or one of the platinum pads 94 of the large capacitor areas 90. The capacitor dot 88 being probed defines the tested capacitive area. During testing in a virtual ground mode, contact to the large capacitor area 90 acts only to capacitively couple into the conductive layers 70, 72, 74, 76, 78.

Figure 5:
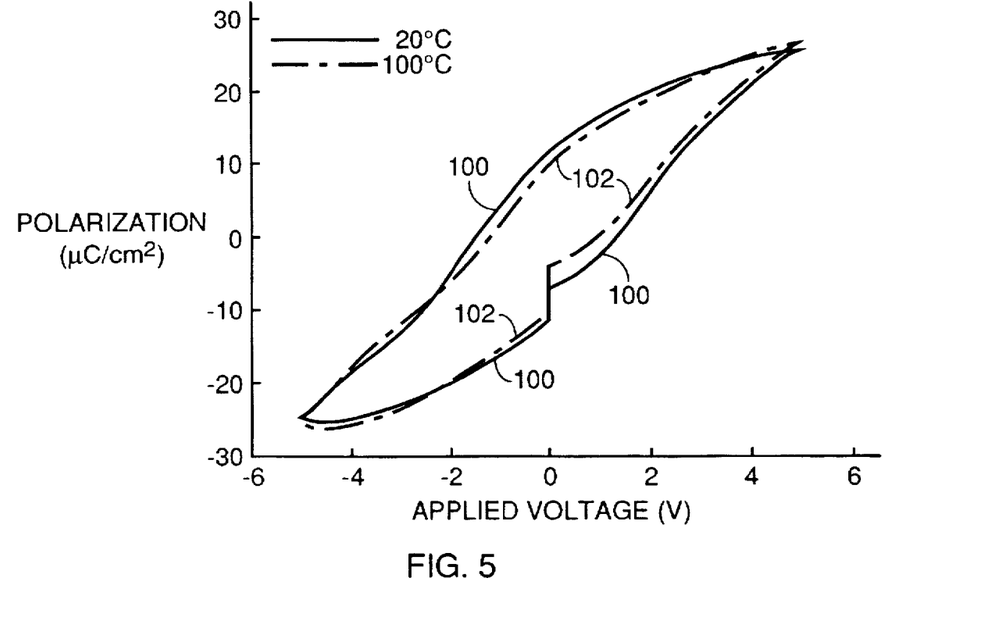
FIG. 5 is a graph of hysteresis loops at two different temperatures for a ferroelectric capacitor built according to the invention.

The resistivity of the PNZT layer 82 was measured to be $2 \times 10^8$ to $10^9$ $\Omega$-$cm^2$. Hysteresis curves were measured for ferroelectric stacks grown at 650° C. at a room-temperature (20° C.) measurement, indicated by trace 100 in the graph of FIG. 5, and at a measurement temperature of 100° C., as indicated by trace 102. These results indicate a remanent polarization ΔP, that is, the difference between switched and unswitched polarizations, of 12.5 μm/$cm^2$ at 5V and testing temperature of 20° C.

Figure 6:
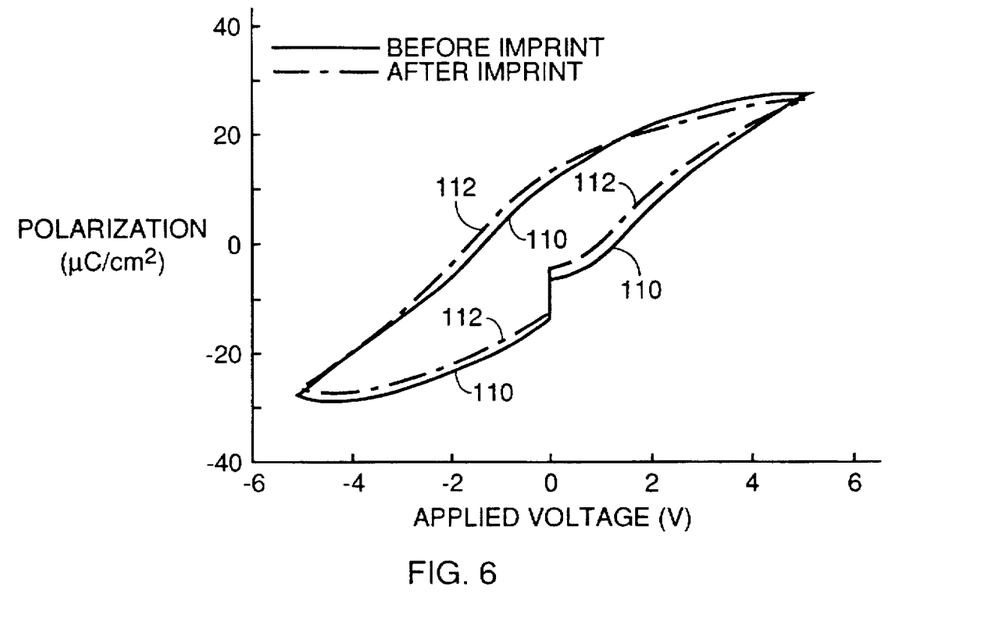
FIG. 6 is a graph of hysteresis loops before and after imprinting for a ferroelectric capacitor of the invention.

The imprint behavior was also measured with this sample, that is, the change in the hysteresis loops after the ferroelectric cell has been subjected to a given bias over a fairly long period. In this experiment, the hysteresis loop was recorded, and then the cell was biased at 5V at 100° C. for 1 hr to achieve the imprint. As shown in the graph of FIG. 6, the hysteresis loop 110 before imprinting does not significantly differ from the hysteresis loop 112 after imprinting at 100° C. for 1 hr during which the cell is impressed with a single-sided pulse of 0 to 5V at a frequency of 30 kHz for a total of $10^8$ cycles. Only a small coercive voltage shift occurred during the imprint stress.

Figure 7:
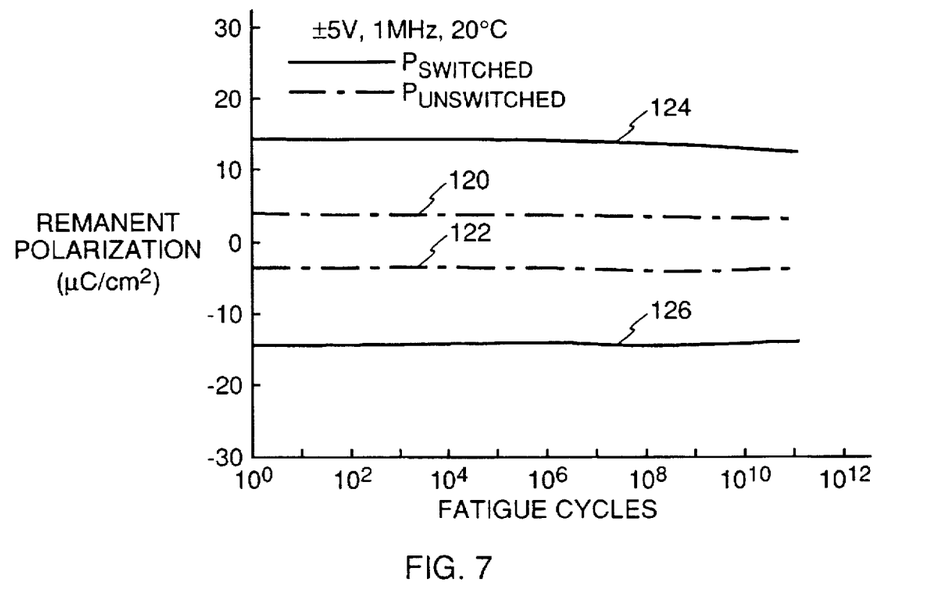
FIGS. 7, 7A, and 7B are graphs at different fatiguing temperatures and cycling rates for various polarization components as a function of time while a ferroelectric capacitor of the invention is being fatigued.
Figure 7A:
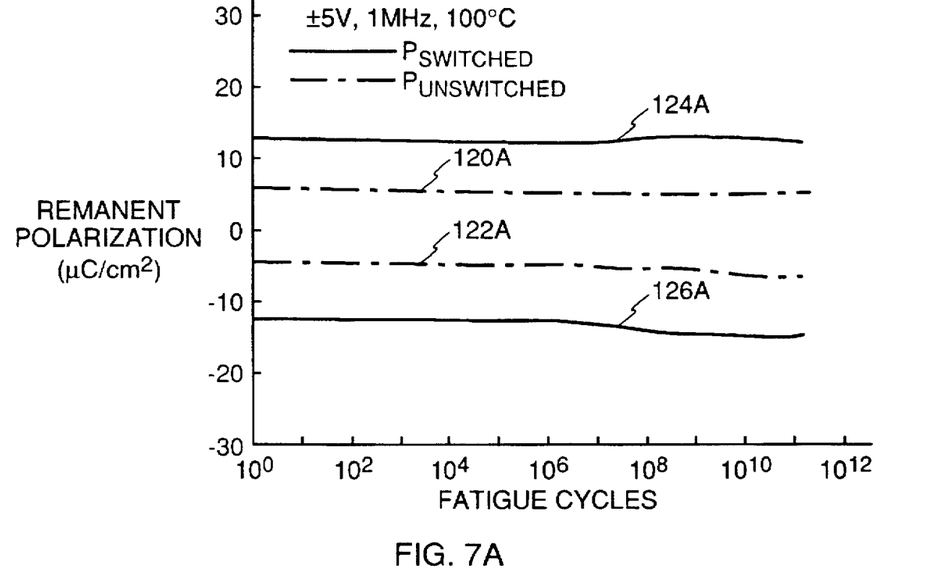
Figure 7B:
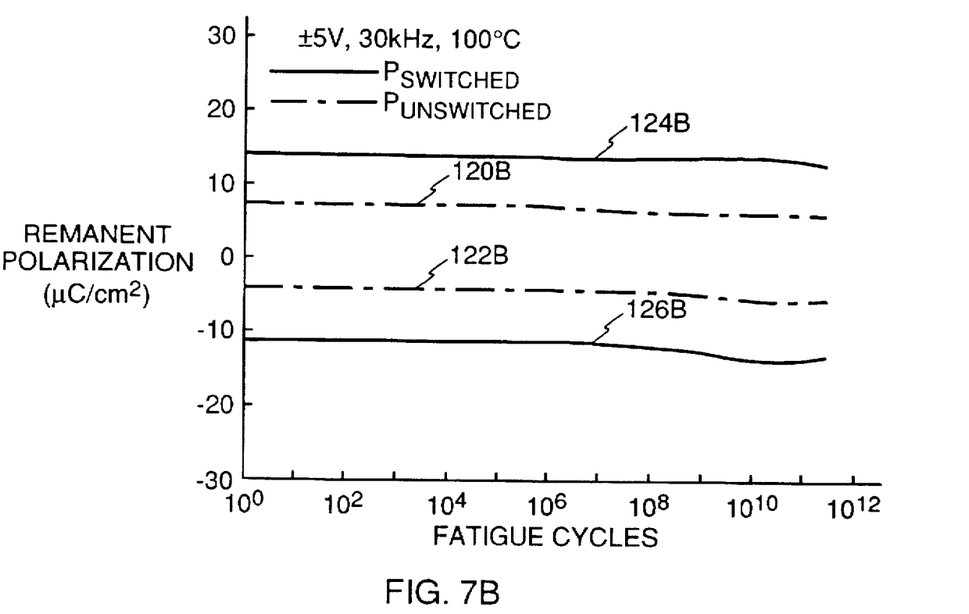

The fatigue characteristics for this cell at room temperature are displayed in the graph of FIG. 7 for which the ferroelectric cell described above was stressed with bipolar square pulses of ±5V at 1 MHz with pulse polarization measurements being performed between the fatiguing pulses. This graph shows traces 120, 122 for unswitched polarization from respective positive and negative states and traces 124, 126 for the respective switched polarization from corresponding states. These data show a remanent polarization ΔP of about 10.4 μC/cm² that does not significantly vary up to $10^{11}$ cycles. Corresponding fatigue characteristics at 100° C. are shown in the graph of FIG. 7A by traces 120A, 122A, 124A, 126A. Other corresponding fatigue characteristics for 100° C. and a cycle rate of 30 kHz are shown in FIG. 7B by traces 120B, 122B, 124B, 126B. These data indicate that the test conditions do not make a significant difference. The data at 30 kHz cycling rate is particularly important since testing at 1 MHz can be faulted as never applying an effective voltage across the ferroelectric material.

Figure 8:
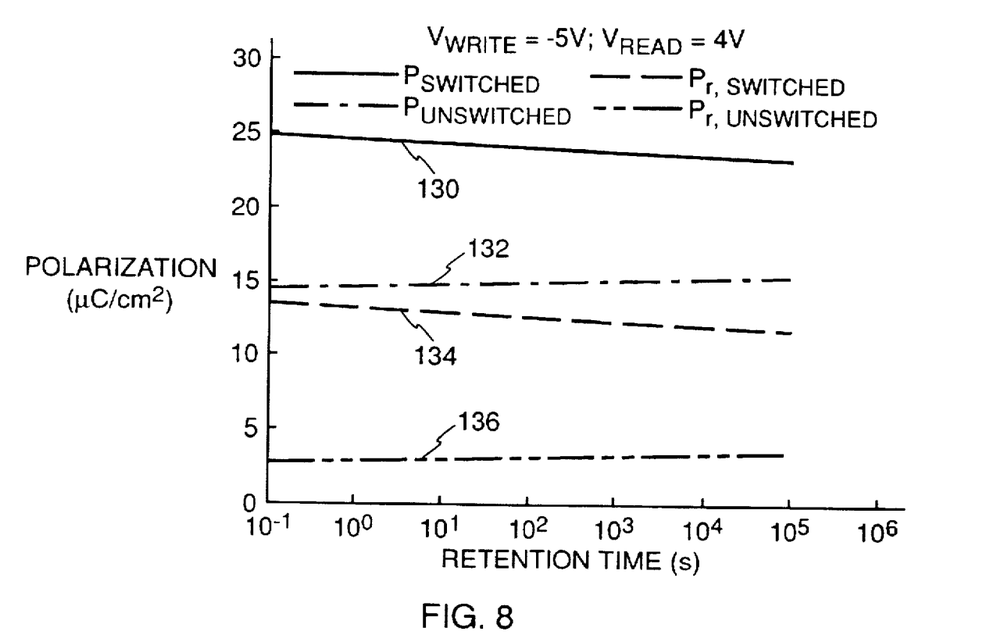
FIGS. 8 and 8A are graphs showing the retention of logic states at two different holding temperatures.
Figure 8A:
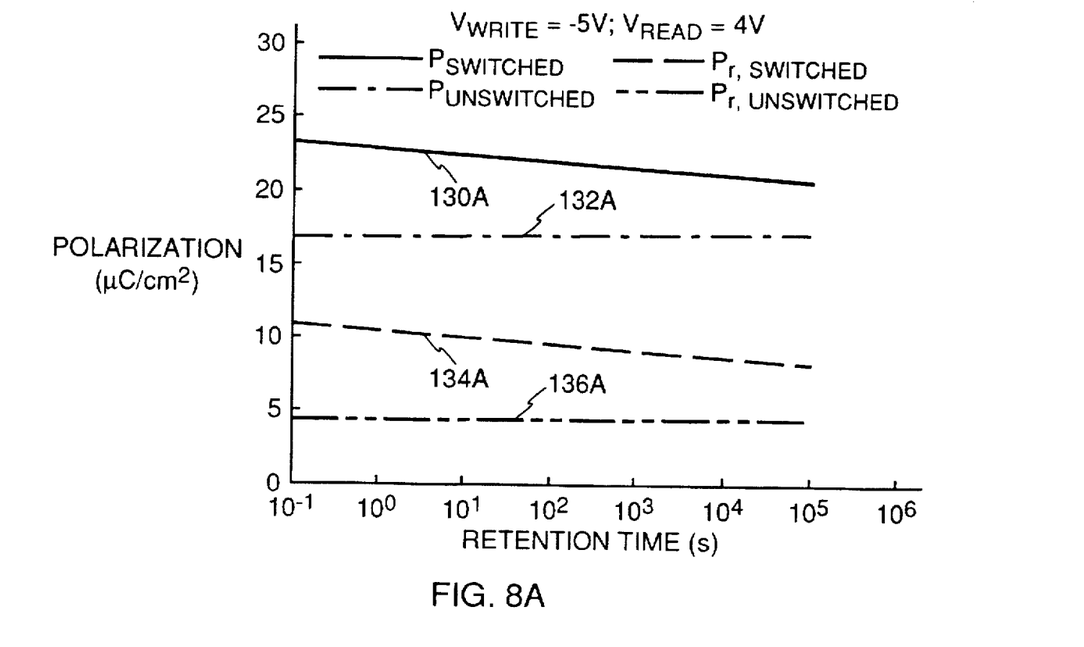
Figure 9:
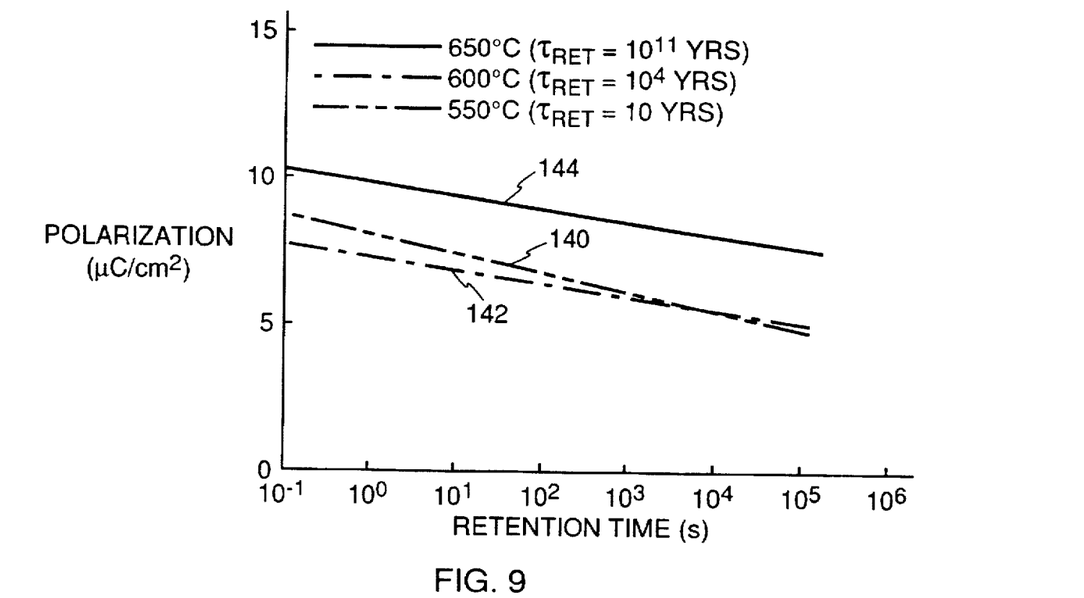
FIG. 9 is a graph of the retention of the logic states for ferroelectric capacitors fabricated at different temperatures.

The retention of logic states at room temperature is shown in the graph of FIG. 8, which shows the magnitude of various polarizations as a function of time for a sample of LSCO/PNZT/LSCO deposited at 650° C. over TiN/polysilicon/crystalline silicon with an intervening intermetallic barrier layer of Ni₃Ti. Traces 130, 132 show the switched and unswitched polarizations and traces 134, 136 show the switched and unswitched remanent polarizations. Corresponding data for retention tested at 100° C. are shown in FIG. 8A by traces 130A, 132A, 134A, 136A. These data show that higher temperatures do not deleteriously affect the ferroelectric characteristics. The retention of logic states for ferroelectric stacks grown at different temperatures is shown by the data of the graph of FIG. 9. The graph shows the difference of the switched and unswitched polarizations as a function of time. Trace 140 for a growth temperature of 550° C. shows a retention life $\tau_{RET}$ of 10 years; trace 142 at 600° C., a retention life of 104 years; and trace 144 at 650° C., a retention life of $10^{11}$ years.

Figure 10:
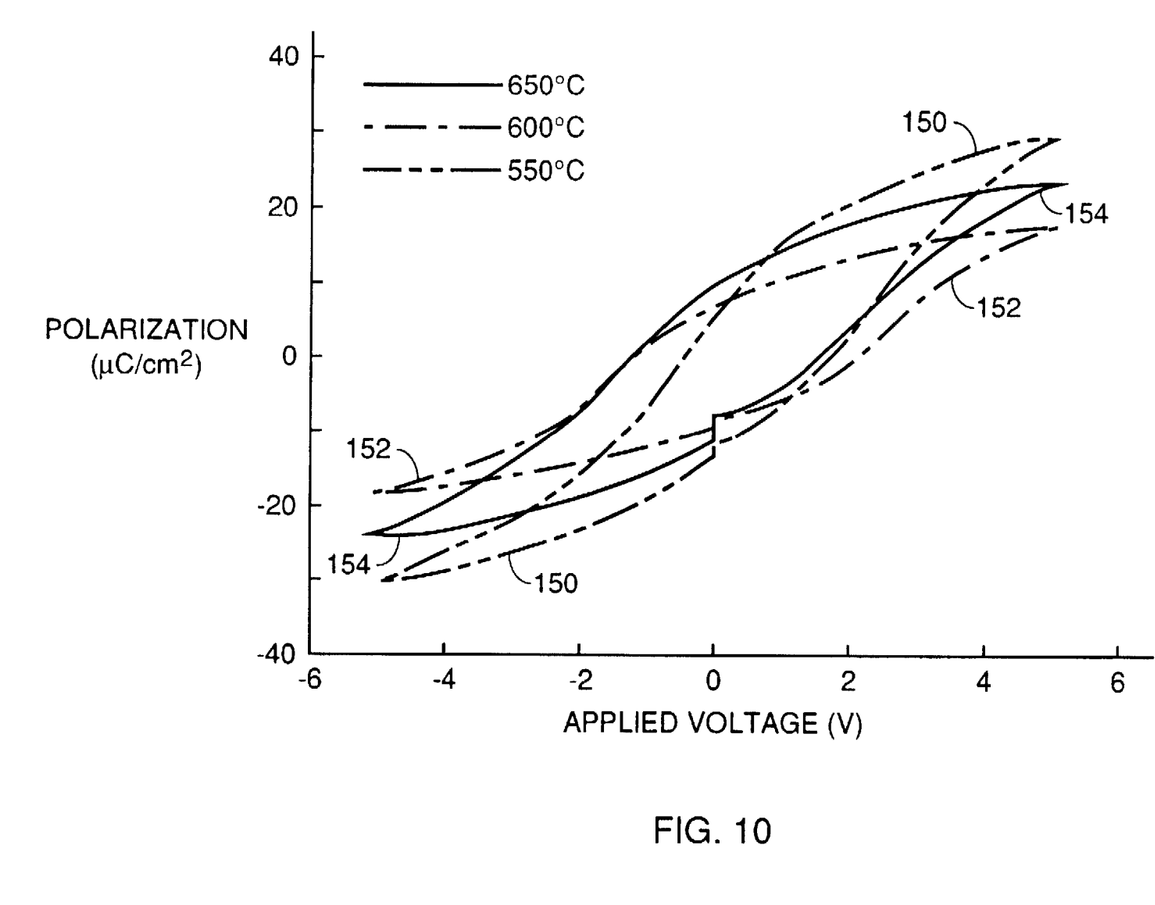
FIG. 10 is a graph of hysteresis loops for several devices with their ferroelectric stacks deposited at different temperatures.

The series of ferroelectric stacks grown at different substrate-holder temperatures were electrically poled. The resultant hysteresis loops are shown in FIG. 10. Trace 150 for the ferroelectric stack grown at 550° C. showed a remanent polarization ΔP of 8.6 μC/cm²; trace 152 for the stack grown at 600° C. showed a ΔP of 10.7 μC/cm²; and trace 154 for the stack grown at 650° C. showed a ΔP of 12.5 μC/cm². Fatigue data for these samples were measured and showed that the remanent polarization did not significantly vary from ±10 μC/cm² for samples fatigued up to 6×10¹⁰ cycles of ±5V at 1 MHz, regardless of whether the ferroelectric stack was deposited at 550°, 600°, or 650° C.

The above described embodiments are intended to be only exemplary and not at all limiting. Many variations are anticipated, and others are included within the invention as defined by the claims.

The ferroelectric layer may be formed from several different families of ferroelectric materials, $Pb_{1-y}La_y(Zr, Ti, Nb)_3$, $Ba_{1-x}Sr_xTiO_3$, $PbNbZrTiO$, and $BiSr(Ta,Nb)O$ being among the most presently popular choices. Lines and Glass provide a fairly comprehensive list of ferroelectric materials, in *Principles and Applications of Ferroelectrics and Related Materials*, (Clarendon Press, 1977), pp. 620–625.

The perovskite electrodes may be formed of other materials, such as $(Sr, Ca)RuO_3$, $LaSrVO$, $YBaCuO$, and $BiSrCaCuO$ among others. Many of these have been thoroughly investigated for high-$T_c$ superconductivity. Our previously cited patent application also describes metal-oxide electrodes having the rock-salt crystal structure, such as NdO, NbO, SmO, LaO, and VO.

The TiN barrier layer can be replaced by a number of other materials that are electrically conductive compounds of a refractory metal and an anion, especially nitrogen. The most prominent of these are titanium tungsten nitride and tantalum silicon nitride.

Although the invention has been explained in the context of the integration of a non-volatile ferroelectric capacitor on a silicon chip, presently the most commercially important use being contemplated, the invention is not so limited. The perovskite material need not be a bistable ferroelectric. Other perovskites, especially some ferroelectrics, demonstrate very large dielectric constants but are not bistable. That is, such a ferroelectric capacitor has a very large capacitance per unit area but does not provide a volatile memory, only a large capacitance or a small volatile memory cell. Also, perovskites may be incorporated into superconducting circuit elements and various magnetic sensors and other devices.

Also, even though silicon substrates present particular advantages for integration with ferroelectric elements, the invention can be applied to integration with other substrates, whether passive, such as glassy silicates, silica, or other ceramics, or other types of semiconductors, such as GaAs.

The invention thus provides ready electrical contacts to perovskite materials, especially ferroelectrics, and assures the reliability and lifetime of the resultant electrical element. It additionally acts as a barrier preventing the migration of deleterious elements in either direction through the electrode. The intermetallic barrier can replace the previously used platinum barrier and is much more amenable to the etching required for integrated-circuit fabrication. Also, the oxidation-resistant intermetallic barrier layer, with or without the underlying TiN barrier layer, allows deposition of the perovskite layers at higher temperatures above 600° C. in an oxidizing environment without the underlying silicon from being oxidized.

Thereby, the intermetallic barrier layer provides beneficial device characteristics while being amenable to easy, large-scale commercial processing.

What is claimed is:

1. A ferroelectric element, comprising:

a substrate;

a barrier layer comprising an intermetallic alloy formed over said substrate;

a first electrode layer comprising a metal oxide formed over said barrier layer; and a ferroelectric layer formed over said first electrode layer; and a second electrode layer formed over said ferroelectric layer;

wherein said intermetallic alloy consists essentially of one of AB, $A_2B$, $A_3B$, $A_2$, and $AB_3$, A and B being metallic elements, and wherein said intermetallic alloy does not deviate from stoichiometry from one of said AB, $A_2B$, $A_3B$, $AB_2$, and $AB_3$ by more than 5 atomic percent.

2. A ferroelectric element as recited in claim 1, wherein said second electrode layer comprises said metal oxide.

3. A ferroelectric element as recited in claim 1, wherein said ferroelectric layer comprises a perovskite material.

4. A ferroelectric element as recited in claim 3, wherein said metal oxide comprises a layered perovskite.

5. A ferroelectric element as recited in claim 1, wherein said substrate comprises semiconductive silicon.

6. A ferroelectric element as recited in claim 5, further comprising a layer of a refractory metal nitride interposed between said substrate and said barrier layer.

7. A ferroelectric element as recited in claim 5, wherein said barrier layer is formed in contact with said semiconductive silicon of said substrate.

8. A ferroelectric element as recited in claim 1, wherein A is selected from the group consisting of Fe, Cr, Co, Ni, Mn, Mo, and Nb and B is selected from the group consisting of Al, Ti, Cr, Si, Ru, Re, and W.

9. A ferroelectric element as recited in claim 1, wherein substantially no platinum is interposed between said barrier layer and said ferroelectric layer.

10. A perovskite element, comprising:

a substrate:

a barrier layer comprising an intermetallic alloy formed over said substrate, said intermetallic alloy comprising metals A and B in atomic ratios chosen from the group of compounds having stoichiometric ratios selected from the group AB, $A_2B$, $A_3B$, $AB_2$, and $AB_3$ and not deviating from said stoichiometric ratios by more than 5 atomic %;

a first layer comprising a conductive metal oxide formed over said barrier layer; and a perovskite layer comprising a perovskite material formed over said first layer.

11. The element of claim 10, wherein said first layer is a first electrode layer and wherein said perovskite layer comprises a ferroelectric and further comprising a second electrode layer formed over said perovskite layer.

12. The ferroelectric element of claim 10, wherein A is chosen from the group consisting of Fe, Cr, Co, Ni, Mn, Mo, and Nb and wherein B is chosen from the group consisting of Al, Ti, Cr, Si, Ru, Re, and W.

13. The element of claim 12, wherein said first layer is a first electrode layer and wherein said perovskite layer comprises a ferroelectric and further comprising a second electrode layer formed over said perovskite layer.

14. The element of claim 11, further comprising a dopant of less than 5 atomic %.

15. The ferroelectric element of claim 14, wherein said dopant is selected from the group consisting of Nb and V.

16. The ferroelectric element of claim 10, wherein said intermetallic alloy comprises the compound $Ti_3Al$.

17. A perovskite element, comprising:

a substrate;

a barrier layer comprising an intermetallic alloy formed over said substrate;

a first layer comprising a conductive metal oxide formed over said barrier layer; and a perovskite layer comprising a perovskite material formed over said first layer;

wherein said intermetallic alloy consists essentially of one of AB, $A_2B$, $A_3B$, $AB_2$ and $AB_3$;

wherein A is selected from the group consisting of Fe, Cr, Co, Ni, Mn, Mo, and Nb and B is selected from the group consisting of Al, Ti, Cr, Si, Ru, Re, and W, and wherein said intermetallic alloy does not deviate from stoichiometry from one of said AB, $A_2B$, $A_3B$, $AB_2$, and $AB_3$ by more than 5 atomic percent.

18. The perovskite element of claim 17, wherein said first layer is a first electrode layer and wherein said perovskite layer comprises a ferroelectric and further comprising a second electrode layer formed over said perovskite layer.

19. The element of claim 17, wherein all said layers are arranged vertically over said substrate, wherein said substrate includes an electrically conductive portion under said barrier layer, and wherein a principal current path extends from said conductive portion of said substrate, vertically through said barrier layer, and to said first layer.

20. The element of claim 1, wherein all said layers are arranged vertically over said substrate, wherein said substrate includes an electrically conductive portion under said barrier layer, and wherein a principal current path extends from said conductive portion of said substrate, vertically through said barrier layer, and to said first electrode layer.

21. The element of claim 10, wherein all said layers are arranged vertically over said substrate, wherein said substrate includes an electrically conductive portion under said barrier layer, and wherein a principal current path extends from said conductive portion of said substrate, vertically through said barrier layer, and to said first layer.

\* \* \* \* \*

UNITED STATES PATENT AND TRADEMARK OFFICE
CERTIFICATE OF CORRECTION

PATENT NO. : 5,777,356
DATED : July 7, 1998
INVENTOR(S) : A.M. Dhote, et al

It is certified that error appears in the above-identified patent and that said Letters Patent is hereby corrected as shown below:

On the title page:

At Item [73] in the heading of the patent, both Bell Communications Research, Inc., Morristown, N.J. and University of Maryland at College Park, College Park, Maryland should be listed as the assignees.

Column 10, line 49: After "$A_3B$" change "$A_2$" to -- $AB_2$ --.

Signed and Sealed this

Tenth Day of August, 1999

Attest:

Q. TODD DICKINSON

*Attesting Officer*     *Acting Commissioner of Patents and Trademarks*